(12) United States Patent
Kim (10) Patent No.: US 11,711,059 B2
(45) Date of Patent: Jul. 25, 2023

(54) SLEW BOOST AMPLIFIER AND DISPLAY DRIVER HAVING THE SAME

(71) Applicant: DB HiTek Co., Ltd., Bucheon-si (KR)

(72) Inventor: Mun Gyu Kim, Seoul (KR)

(73) Assignee: DB HiTek, Co., Ltd., Bucheon-si (KR)

( * ) Notice: Subject to any disclaimer, the term of this patent is extended or adjusted under 35 U.S.C. 154(b) by 0 days.

(21) Appl. No.: 18/049,814

(22) Filed: Oct. 26, 2022

(65) Prior Publication Data

US 2023/0146284 A1    May 11, 2023

(30) Foreign Application Priority Data

Nov. 8, 2021  (KR) .......................... 10-2021-0151942

(51) Int. Cl.
  *H03F 3/45*   (2006.01)
  *G09G 3/20*   (2006.01)

(52) U.S. Cl.
  CPC ........... *H03F 3/45179* (2013.01); *G09G 3/20* (2013.01); *G09G 2300/0819* (2013.01); *G09G 2310/0291* (2013.01); *G09G 2330/021* (2013.01); *G09G 2360/10* (2013.01); *H03F 2203/45096* (2013.01); *H03F 2203/45248* (2013.01)

(58) Field of Classification Search
  CPC .......... G02F 1/134336; G02F 1/13306; G09G 3/3655; G09G 5/022; G09G 3/3696; G09G 2310/06; G09G 2320/0223; G09G 2320/0242; G09G 2340/0435; G09G 2330/021; G09G 2320/103
  See application file for complete search history.

(56) References Cited

U.S. PATENT DOCUMENTS

| | | | |
|---|---|---|---|
| 8,466,909 B2 | 6/2013 | An et al. | |
| 2003/0227328 A1* | 12/2003 | Ivanov | H03F 3/3028 330/264 |
| 2011/0148893 A1 | 6/2011 | An et al. | |
| 2013/0088473 A1* | 4/2013 | Tsuchi | G09G 3/3291 330/257 |
| 2015/0084694 A1* | 3/2015 | Lee | H03F 1/483 327/170 |
| 2017/0032755 A1* | 2/2017 | Ko | G09G 3/3648 |
| 2019/0221153 A1* | 7/2019 | Tsuchi | H03K 19/017509 |

FOREIGN PATENT DOCUMENTS

KR    10-1579839 B1    12/2015

\* cited by examiner

*Primary Examiner* — Shaheda A Abdin (74) *Attorney, Agent, or Firm* — Andrew D. Fortney; Central California IP Group, P.C.

(57) ABSTRACT

Disclosed are a slew boost amplifier and a display driver having the same, which include a first current generation circuit configured to apply a first current to an upper current mirror circuit, a second current generation circuit configured to apply a second current to a lower current mirror circuit, and a comparison circuit configured to detect a difference between an input voltage and an output voltage and to apply the first current when the difference is greater than or equal to a first predetermined threshold and the second current generation circuit to apply the second current when the difference is less than a second predetermined threshold.

11 Claims, 6 Drawing Sheets

SLEW BOOST AMPLIFIER AND DISPLAY DRIVER HAVING THE SAME

CROSS REFERENCE TO RELATED APPLICATION

The present application claims priority to Korean Patent Application No. 10-2021-0151942, filed Nov. 8, 2021, the entire contents of which are incorporated herein for all purposes by this reference.

FIELD

The present disclosure relates to a slew boost amplifier and a display driver having the same. More particularly, the present disclosure relates to a slew boost amplifier and a display driver having the same, which include a first current generation circuit configured to apply a first current to an upper current mirror circuit (or an output terminal thereof); a second current generation circuit configured to apply a second current to a lower current mirror circuit (or an output terminal thereof); and comparison circuit configured to detect a difference between an input voltage and an output voltage and to cause the first current generation circuit to apply the first current when the difference is greater than or equal to a first predetermined threshold and the second current generation circuit to apply the second current when the difference is less than a second predetermined threshold.

BACKGROUND

Recently, as a display is configured with a high resolution and an enlarged size, driving time of display elements in the display decreases. When a source driving circuit fails to drive a data line of a display panel to a target voltage within the driving time, a problem occurs in image quality. Therefore, the need for a source driving circuit having a high slew rate is continuously increasing.

In addition, as the demand for low-power and high-resolution portable terminals and electronic displays is rapidly increasing, demand for a Display Driver IC (DDI) with a high slew rate performance to charge a display panel in a short time increases. At this time, there is a technique for improving an overall performance by increasing the current consumption of an amplifier (AMP) that serves as a source driver in the DDI to implement the high slew rate.

However, the DDI with increased current consumption by the amplifier has difficulties in portable electronic device applications using a battery (e.g., due to the current consumption).

Accordingly, research on a display driver having a high slew rate, but without an increase in current consumption, is continuously being conducted.

The foregoing is intended merely to aid in the understanding of the background of the present disclosure, and is not intended to mean that the present disclosure falls within the purview of the related art, or that is already known to those skilled in the art.

Document of Related Art

Korean Patent No. 10-1579839, entitled "Output buffer having high slew rate, method for controlling output buffer, and display drive IC having same."

BRIEF DESCRIPTION

Accordingly, the present inventor has conceived a novel slew boost amplifier and a display driver having the same, the details of which will be described later.

The present disclosure has been made keeping in mind the above problems occurring in the related art, and an objective of the present disclosure is to provide a slew boost amplifier and a display driver having the same, wherein the slew boost amplifier and the display driver provide a current path by comparing an input voltage and an output voltage, thereby amplifying a signal at a high slew rate (or increasing the slew rate) without increasing power consumption (current consumption).

In addition, another objective of the present disclosure is to provide the slew boost amplifier and the display driver having the same, wherein the slew boost amplifier and the display driver provide a high slew rate without an increase in power consumption, thereby allowing the high slew rate to be embodied even in a portable electronic device.

In addition, still another objective of the present disclosure is to provide the slew boost amplifier and the display driver having the same, wherein the slew boost amplifier and the display driver amplify the slew rate by comparing the input voltage and the output voltage, thereby allowing the slew rate to be increased and/or a driver signal to be quickly amplified even without an additional control circuit, and the slew rate increase and/or signal amplification to be embodied with a circuit having a small area.

In order to achieve the above-described objectives, the present disclosure may be implemented by one or more embodiments having one or more of the following configurations.

According to one or more embodiments of the present disclosure, there may be provided a slew boost amplifier, including a first current generation circuit configured to apply a first current to an upper current mirror circuit (or an output terminal thereof); a second current generation circuit configured to apply a second current to a lower current mirror circuit (or an output terminal thereof); and a comparison circuit configured to detect a difference between an input voltage and an output voltage and to cause the first current generation circuit to apply the first current when the difference is greater than or equal to a first predetermined threshold and the second current generation circuit to apply the second current when the difference is less than a second predetermined threshold.

According to another embodiment of the present disclosure, in the slew boost amplifier according to the present disclosure, is at least a first set value greater than the output voltage, the first current generation circuit may apply the first current to a first output terminal of the upper current mirror circuit.

According to still another embodiment of the present disclosure, in the slew boost amplifier according to the present disclosure, when the input voltage is less than the output voltage by at least a second set value, the second current generation circuit may apply the second current to a first output terminal of the lower current mirror circuit.

According to still another embodiment of the present disclosure, a slew boost amplifier, connected to an output buffer circuit having an upper current mirror circuit and a lower current mirror circuit, according to the present disclosure may include a first current generation circuit configured to apply a first current to a first output terminal of the upper current mirror circuit; a second current generation circuit configured to apply a second current to a first output terminal of the lower current mirror circuit; and a comparison circuit configured to detect a difference between an input voltage and an output voltage and to cause one of the first current generation circuit and the second current generation circuit to apply the first current or the second current when the difference occurs, wherein the comparison circuit may include a first transistor providing a first current path, having a gate node connected to a power input line and/or configured to receive the input voltage, a source node connected to a line providing the output voltage, and a drain node connected to the first current generating circuit, and a second transistor providing a second current path, having a gate node connected to the power input line and/or configured to receive the input voltage, a source node connected to the line providing the output voltage, and a drain node connected to the second current generating circuit.

According to still another embodiment of the present disclosure, the first current generation circuit in the slew boost amplifier according to the present disclosure may include a third transistor having a gate node and a source node connected to the drain node of the first transistor; a fourth transistor having a gate node configured to receive a first bias signal, and a source node connected to a drain node of the third transistor; and a fifth transistor having a gate node connected to the drain node of the first transistor, a source node connected to a power supply, and a drain node connected to the first output terminal of the upper current mirror circuit.

According to still another embodiment of the present disclosure, when the input voltage is greater than or equal to (i) the output voltage, (ii) a first set value greater than the output voltage, or (iii) greater that a threshold voltage of the first transistor in the slew boost amplifier according to the present disclosure, the first transistor provides the first current path, the first current path being connected to the third transistor and the fourth transistor, and the fifth transistor may apply a third current mirroring the first current to the first output terminal of the upper current mirror circuit.

According to still another embodiment of the present disclosure, the second current generation circuit in the slew boost amplifier according to the present disclosure may include a sixth transistor having a gate node and a source node connected to the drain node of the second transistor; a seventh transistor having a gate node configured to receive a second bias signal, and a source node connected to a drain node of the sixth transistor; and an eighth transistor having a gate node connected to the drain node of the second transistor, a source node connected to a ground potential, and a drain node connected to the first output terminal of the lower current mirror circuit.

According to still another embodiment of the present disclosure, when the input voltage is less than (i) the output voltage, (ii) a second set value less than the output voltage, or (iii) less than a power supply minus a threshold voltage of the second transistor in the slew boost amplifier according to the present disclosure, the second transistor provides the second current path, the second current path being connected to the sixth transistor and the seventh transistor, and the eighth transistor may apply a fourth current mirroring the second current to the first output terminal of the lower current mirror circuit.

According to one or more embodiments of the present disclosure, there may be provided a display driver, the display driver including an output buffer circuit comprising an upper current mirror circuit and a lower current mirror circuit and outputting a first signal and a second signal in response to an input signal; and a slew boost amplifier configured to apply a current to one of the upper current mirror circuit and the lower current mirror circuit on the basis of a difference between the input signal and an output signal.

According to another embodiment of the present disclosure, the amplifier in the display driver according to the present disclosure may include a first current generation circuit configured to apply a first current to an output terminal of the upper current mirror circuit; a second current generation circuit configured to apply a second current to an output terminal of the lower current mirror circuit; and a comparison circuit configured to detect the difference between the input voltage and the output voltage and to output the output voltage by opening a current path in one of the first current generation circuit and the second current generation circuit when the difference occurs.

According to still another embodiment of the present disclosure, in the display driver according to the present disclosure, when the input voltage is greater than or equal to (i) the output voltage, (ii) a first set value greater than the output voltage, or (iii) greater than a threshold voltage of a first transistor in the comparison circuit, to the first current generation circuit carries the first current on a first current path, and the first current generation circuit may apply the first current on the first current path to the output terminal of the upper current mirror circuit.

According to still another embodiment of the present disclosure, in the display driver according to the present disclosure, when the input voltage is less than (i) the output voltage, (ii) a second set value less than the output voltage, or (iii) less than a power supply minus a threshold voltage of a second transistor in the comparison circuit, the second current generation circuit carries the second current on a second current path, and the second current generation circuit may apply the second current on the second current path to the output terminal of the lower current mirror circuit.

According to still another embodiment of the present disclosure, the display driver according to the present disclosure may include an output buffer circuit comprising an upper current mirror circuit and a lower current mirror circuit and outputting a first signal and a second signal in response to an input signal; and a slew boost amplifier configured to apply a current to one of a first output terminal of the upper current mirror circuit and a first output terminal of the lower current mirror circuit on a basis of a difference between the input signal and an output signal, wherein the slew boost amplifier may include a first current generation circuit configured to apply a first current to the first output terminal of the upper current mirror circuit; a second current generation circuit configured to apply a second current to the first output terminal of the lower current mirror circuit; and a comparison circuit configured to detect the difference between the input voltage and the output voltage and to apply the first current to the first output terminal of the upper current mirror circuit or the second current to the first output terminal of the lower current mirror circuit from a first current path in the first current generation circuit or a second current path in the second current generation circuit when the difference occurs.

According to still another embodiment of the present disclosure, the comparison circuit in the display driver according to the present disclosure may include a first transistor providing the first current path, having a gate node connected to a power input line and/or configured to receive the input voltage, a source node connected to a line providing the output voltage, and a drain node connected to the first current generating circuit, and a second transistor providing a second current path, having a gate node connected to the power input line and/or configured to receive the input voltage, a source node connected to the line providing the output voltage, and a drain node connected to the second current generating circuit.

According to still another embodiment of the present disclosure, the first current generation circuit in the display driver according to the present disclosure may include a third transistor having a gate node and a source node connected to the drain node of the first transistor; a fourth transistor having a gate node configured to receive a first bias signal, and a source node connected to a drain node of the third transistor; and fifth a transistor having a gate node connected to the drain node of the first transistor, a source node connected to a power supply, and a drain node connected to the first output terminal of the upper current mirror circuit.

According to still another embodiment of the present disclosure, when the input voltage is greater than or equal to (i) the output voltage, (ii) a first set value greater than the output voltage, or (iii) greater than a threshold voltage of the first transistor, the first transistor in the display driver according to the present disclosure may provide the first current path, and the first current path may be connected to the third transistor and the fourth transistor, and the fifth transistor may apply a third current mirroring the first current to the first output terminal of the upper current mirror circuit.

According to still another embodiment of the present disclosure, the second current generation circuit in the display driver according to the present disclosure may include a sixth transistor having a gate node and a source node connected to the drain node of the second transistor; a seventh transistor having a gate node configured to receive a second bias signal, and a source node connected to a drain node of the sixth transistor; and an eighth transistor having a gate node connected to the drain node of the second transistor, a source node connected to a ground potential, and a drain node connected to the first output terminal of the lower current mirror circuit.

According to still another embodiment of the present disclosure, when the input voltage is less than (i) the output voltage, (ii) a second set value less than the output voltage, or (iii) less than a power supply minus a threshold voltage of the second transistor, the second transistor in the display driver according to the present disclosure may provide the second current path, the second current path being connected to the sixth transistor and the seventh transistor, and the eighth transistor applies a fourth current mirroring the second current to the first output terminal of the lower current mirror circuit.

According to still another embodiment of the present disclosure, the output buffer circuit in the display driver according to the present disclosure may include a load circuit and an output circuit, where the load circuit may include an upper current mirror circuit comprising ninth and tenth transistors, each having a gate connected to the drain node of the fifth transistor; and a lower current mirror circuit comprising eleventh and twelfth transistors, each having a gate connected to the drain node of the eighth transistor, and the output circuit may include a thirteenth transistor having a gate connected to a second output terminal of the upper current mirror circuit and connected between the power supply and an output terminal of the output circuit; and a fourteenth transistor having a gate connected to a second output terminal of the lower current mirror circuit and connected between the output terminal of the output circuit and the ground potential.

According to still another embodiment of the present disclosure, the load circuit in the display driver according to the present disclosure may further include a first connection circuit including a fifteenth transistor configured to receive a first bias voltage and a sixteenth transistor configured to receive a second bias voltage; and a second connection circuit including a seventeenth transistor configured to receive the first bias voltage and an eighteenth transistor MN6 configured to receive the second bias voltage, wherein the first connection circuit electrically connects the second output terminal of the upper current mirror circuit and the second output terminal of the lower current mirror circuit, and the second connection circuit electrically connects the first output terminal of the upper current mirror circuit and the first output terminal of the lower current mirror circuit.

The present disclosure has the following effects by the above configuration.

The present slew boost amplifier and display driver having the same may provide a current path by comparing an input voltage and an output voltage, thereby increasing or amplifying a high slew rate without increasing power consumption (current consumption).

In addition, the present slew boost amplifier and display driver having the same can provide a high slew rate without an increase in power consumption, and may allow a high slew rate to be embodied in a portable electronic device.

In addition, the present slew boost amplifier and display driver having the same can increase or amplify the slew rate by comparing the input voltage and the output voltage, thereby allowing the slew rate to be increased or amplified without an additional control circuit and/or the slew rate increase or amplification to be embodied in a circuit having a small area.

On the other hand, even if certain effects are not explicitly mentioned herein, the effects described in the following specification expected by the technical features of the present disclosure and potential effects thereof are treated as if they were described in the present specification.

DETAILED DESCRIPTION

Hereinafter, exemplary embodiments of the present disclosure will be described in detail with reference to the accompanying drawings. Embodiments of the present disclosure may be modified in various forms, and the scope of the present disclosure should not be construed as being limited to the following embodiments but should be interpreted on the basis of matters described in the claims. In addition, the present embodiment is provided for reference in order to more completely explain the present disclosure to those skilled in the art.

As used herein, a singular form may include a plural form unless the context clearly dictates otherwise. In addition, as used herein, the terms "comprise" and/or "comprising" refer to the presence of the recited shapes, numbers, steps, actions, members, elements, and/or groups thereof and does not exclude the presence or addition of one or more other shapes, numbers, movements, members, elements and/or groups thereof.

In addition, it should be noted that, although numbers may be used in describing configurations such as "first" and "second" below, the second configuration does not presuppose the first configuration, and each configuration may be mutually independent.

The slew boost amplifier and the display driver having the same according to embodiment(s) of the present disclosure are configured to amplify a signal and/or increase the slew rate without increasing current consumption, and thus may also be applied to displays that need to charge the display panel in a short time and to have a high slew rate performance together.

Hereinafter, a display driver to which the slew boost amplifier and an output buffer circuit according to embodiment(s) of the present disclosure are applied will be described with reference to the accompanying drawings.

Figure 1:
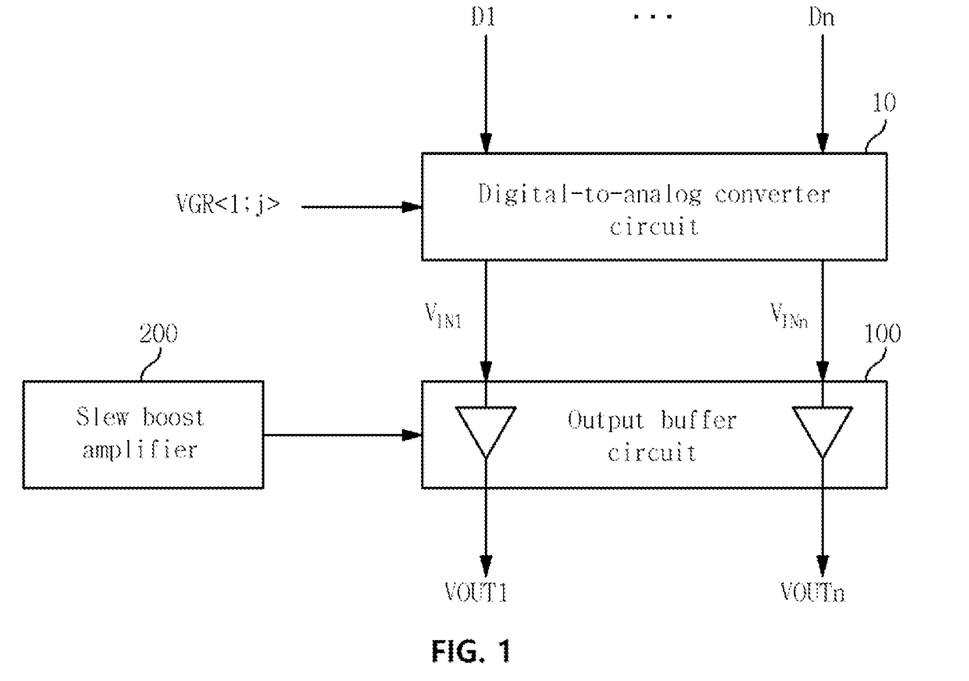
FIG. 1 is a block diagram illustrating a display driving apparatus including a slew boost amplifier and an output buffer circuit according to one or more embodiments of the present disclosure.

FIG. 1 is a block diagram illustrating a display driving apparatus including a slew amplification circuit and an output buffer circuit according to one or more embodiments of the present disclosure.

With reference to FIG. 1, the display driver includes a digital-to-analog converter circuit 10, an output buffer circuit 100, and a slew boost amplifier 200. Though not shown in FIG. 1, the display driver may include a restoration circuit configured to restore a data signal (e.g., in response to an input signal from a timing controller), a latch circuit configured to latch the restored data signal, and the like.

The digital-to-analog converter circuit 10 selects the grayscale voltages VGR<1:j> corresponding to the data signals D1 to Dn, converts the selected grayscale voltages VGR<1:j> to the data voltages VIN1 to VINn, and then provides the data voltages VIN1 to VINn to the output buffer circuit 100.

The output buffer circuit 100 buffers, outputs and/or drives the data voltages VIN1 to VINn from the digital-to-analog converter circuit 10 and provides the source driving signals VOUT1 to VOUTn to data lines of a display panel (not shown). Such an output buffer circuit 100 includes a plurality of output buffers configured to buffer, output and/or drive signals to prevent distortion of the source driving signals VIN1 to VINn supplied to the data line. In this case, an operational amplifier (op-amp) may be used as the output buffer.

The slew boost amplifier 200 compares the input voltage and the output voltage and, when the difference between the input voltage and the output voltage occurs (e.g., exceeds a predetermined threshold), outputs a current to the output buffer circuit 100 to increase or amplify the slew rate of the output buffer circuit 100. In this case, it is assumed that the input voltage is the data voltage VIN and the output voltage is the source driving signal VOUT.

The output buffer circuit 100 increases the slew rate by the current applied from the slew amplification circuit 200 and, through this, is capable of increasing the slew rate without additional current consumption.

Hereinafter, the output buffer circuit 100 according to an embodiment of the present disclosure will be described with reference to the accompanying drawings.

Figure 2:
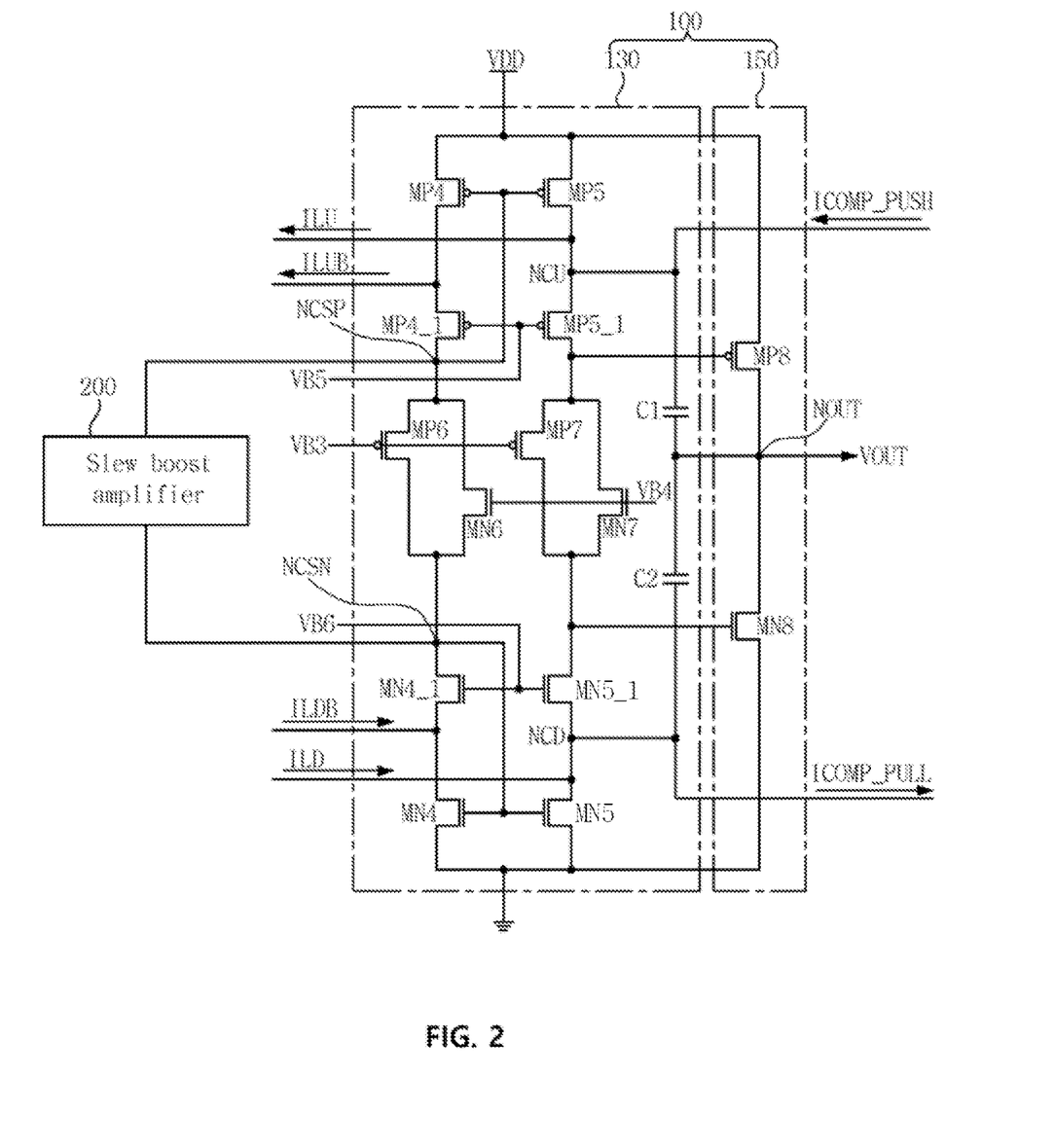
FIG. 2 is a circuit diagram illustrating an output buffer circuit according to one or more embodiments of the present disclosure.

FIG. 2 is a circuit diagram illustrating an output buffer circuit 100 according to an embodiment of the present disclosure.

With reference to FIG. 2, the output buffer circuit 100 includes a load circuit 130 and an output circuit 150. Hereinafter, only the configuration and operation of the output buffer circuit 100 will be described, and the connection and an operation of the slew boost amplifier 200 will be described in detail in the description of the slew boost amplifier 200.

The load circuit 130 may include an upper current mirror circuit comprising PMOS transistors MP4_1 and MP5_1 that operate in response to a bias voltage VB5, and composed of PMOS transistors MP4 and MP5. The load circuit 130 may further include, or one or more pairs of the transistors MP4_1, MP5_1, MP4 and MP5 may form, an upper cascode circuit connected between first and second connection circuits. In addition, the load circuit 130 may include a lower current mirror circuit comprising NMOS transistors MN4_1 and MN5_1 that operate in response to a bias voltage VB6, and NMOS transistors MN4 and MN5. The load circuit 130 may further include, or one or more pairs of the transistors MN4_1, MN5_1, MN4 and MN5 may form, a lower cascode circuit connected between the first and second connection circuits. The load circuit 130 having the cascode circuits has a large output impedance, so the output buffer circuit 100 including the load circuit 130 may obtain a high voltage gain.

The upper current mirror circuit may include PMOS transistors MP4 and MP5 connected in the form of a current mirror, and the lower current mirror circuit may include NMOS transistors MN4 and MN5 connected in the form of a current mirror. The first connection circuit may include a PMOS transistor MP7 that operates in response to a third bias voltage VB3 and an NMOS transistor MN7 that operates in response to a fourth bias voltage VB4. The second connection circuit may include a PMOS transistor MP6 that operates in response to the third bias voltage VB3 and an NMOS transistor MN6 that operates in response to the fourth bias voltage VB4.

The upper current mirror circuit is electrically connected to a first input stage comprising PMOS transistors MP1 and MP2, which may be in an input terminal (not shown) and which may supply a current to the load circuit 130.

The lower current mirror circuit is electrically connected to a second input stage including NMOS transistors MN1 and MN2, which may be in the input terminal (not shown) and which may supply a current to the load circuit 130. The first connection circuit may be electrically and/or indirectly connected to a first output terminal NCU of the upper current mirror circuit and a first output terminal NCD of the lower current mirror circuit. The second connection circuit may electrically connect a second output terminal NCSP of the upper current mirror circuit and a second output terminal NCSN of the lower current mirror circuit. A first capacitor C1 may be connected between the first output terminal NCU of the upper current mirror circuit and an output terminal NOUT of the output circuit 150, and a second capacitor C2 may be connected between the first output terminal NCD of the lower current mirror circuit and the output terminal NOUT of the output circuit 150.

The output circuit 150 may include a PMOS transistor MP8 having a gate connected to the first output terminal NCU of the upper current mirror circuit. The PMOS transistor MP8 may be a pull-up driver connected between a power supply voltage VDD and the output terminal NOUT. The output circuit 150 may further include an NMOS transistor MN8 having a gate connected to the first output terminal NCD of the lower current mirror circuit. The NMOS transistor MN8 may be a pull-down driver connected between the output terminal NOUT and the ground.

A push compensation current ICOMP_PUSH may be provided to the first output terminal NCU of the upper current mirror circuit, and a pull compensation current ICOMP_PULL may be provided to the first output terminal NCD of the lower current mirror circuit.

A pushing load current ILU may flow from the first output terminal NCU of the upper current mirror circuit (e.g., to a second input terminal, from a circuit comprising NMOS transistors, or another input terminal; not shown), and another (e.g., complementary) pushing load current ILUB may flow from the second output terminal NCSP of the upper current mirror circuit (e.g., to another second input terminal or the other input terminal; not shown).

A pulling load current ILD may flow from a first input terminal, from a circuit comprising PMOS transistors, and/or from another input terminal (not shown) to the first output terminal NCD of the lower current mirror circuit, and another (e.g., complementary) pulling load current ILDB may flow from a different first input terminal or a different other input terminal (not shown) to the second output terminal NCSN of the lower current mirror circuit.

Hereinafter, the slew boost amplifier 200 according to an embodiment of the present disclosure will be described with reference to the accompanying drawings.

Figure 3:
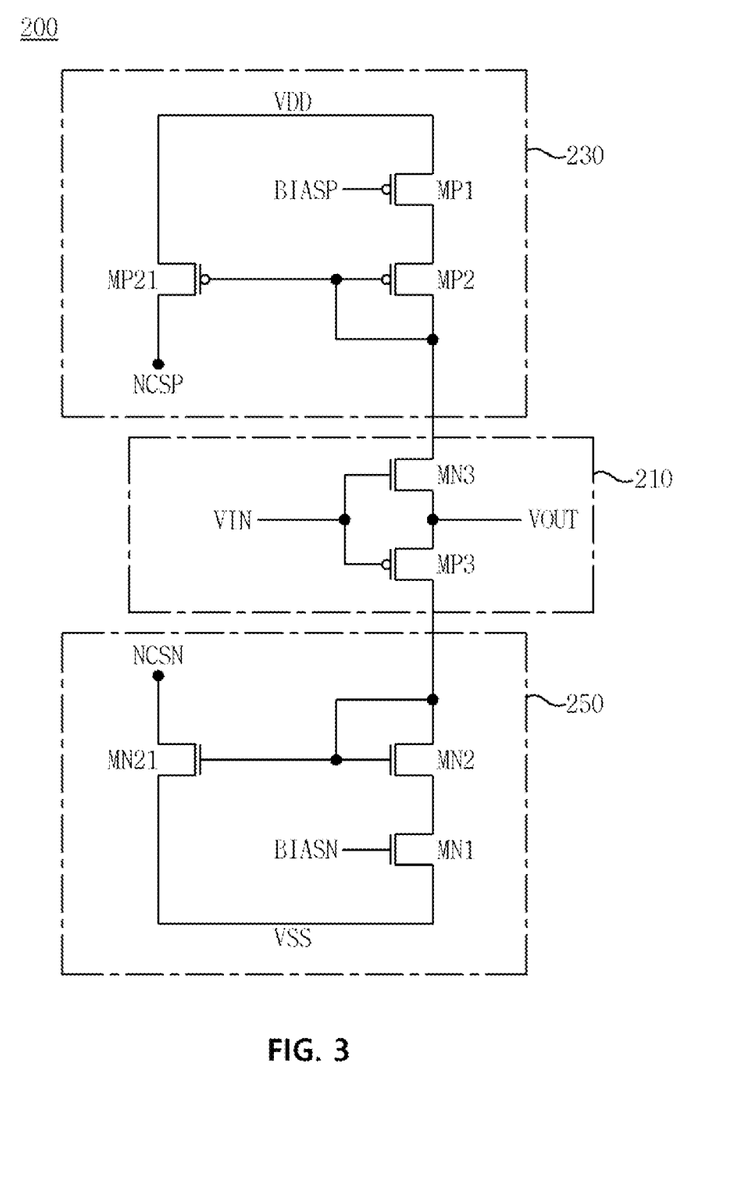
FIG. 3 is a circuit diagram illustrating a slew boost amplifier according to an embodiment of the present disclosure.

FIG. 3 is a circuit diagram illustrating a slew amplification circuit according to an embodiment of the present disclosure.

With reference to FIG. 3, the slew amplification circuit 200 generates a current path for slew increase or amplification when a difference between an input voltage and an output voltage occurs (e.g., crosses a predetermined threshold). In this case, the slew amplification circuit 200 includes a comparison circuit 210 that compares a difference between the input voltage and the output voltage or determines whether the difference between the input voltage and the output voltage crosses a threshold, a first current generation circuit 230, and a second current generation circuit 250.

The comparison circuit 210 generates a current path to the first current generation circuit 230 when the input voltage VIN is at least a set or predetermined value greater than the output voltage VOUT (e.g., is greater than the threshold voltage of the NMOS transistor MN3). The comparison circuit 210 generates a current path to the second current generation circuit 250 when difference between the input voltage VIN and the output voltage VOUT is less than the set or predetermined value (e.g., the input voltage VIN is less than the supply voltage VDD minus the threshold voltage of the PMOS transistor MP3).

To this end, the comparison circuit 210 includes a transistor MP3 and a transistor MN3. Here, a gate node of the transistor MP3 and a gate node of the transistor MN3 are connected to a power input line to receive an input voltage VIN. In addition, a source node of the transistor MP3 and a source node of the transistor MN3 are connected to a power output line to receive an output voltage VOUT. In addition, a drain node of the transistor MP3 is connected to the first current generation circuit 230, and a drain node of the transistor MN3 is connected to a second current generation circuit 250.

The first current generation circuit 230 generates a current on a first current path along with the comparison circuit 210 (e.g., when the transistor MN3 is conducting a current). The first current generation circuit 230 applies the current from the first current path to the second output terminal NCSP of the output buffer circuit 100.

To this end, the first current generation circuit 230 includes a transistor MP2, a transistor MP1, and a transistor MP21, all of which may be PMOS transistors.

A gate node and a source node of the transistor MP2 are connected to the comparison circuit 210. That is, the gate node and the source node of the transistor MP2 are connected to the drain node of the transistor MN3. In addition, a drain node of the transistor MP2 is connected to a source node of the transistor MP1.

A gate node of the transistor MP1 is connected to a signal line that receives a bias signal BIASP. In addition, a source node of the transistor MP1 is connected to the drain node of the transistor MP2. In addition, a drain node of the transistor MP1 is connected to a power supply VDD.

A gate node of the transistor MP21 is also connected to the comparison circuit 210. That is, the gate node of the transistor MP21 is connected to the drain node of the transistor MN3. The gate node of the transistor MP21 is also connected to the gate node of the transistor MP2. In addition, a source node of the transistor MP21 is connected to the power supply VDD, and a drain node of the transistor MP21 is connected to the output terminal NCSP of the output buffer circuit 100.

The second current generation circuit 250 generates a current on a second current path along with the comparison circuit 210 (e.g., when the transistor MP3 is conducting a current). The second current generation circuit 250 applies the current from the second current path to the second output terminal NCSN of the output buffer circuit 100.

To this end, the second current generation circuit 250 includes a transistor MN2, a transistor MN1, and a transistor MN21, all of which may be NMOS transistors.

A gate node and a source node of the transistor MN2 are connected to the comparison circuit 210. That is, the gate node and the source node of the transistor MN2 are connected to the drain node of the transistor MP3. In addition, a drain node of the transistor MN2 is connected to a source node of the transistor MN1.

A gate node of the transistor MN1 is connected to a signal line that receives a bias signal BIASN. In addition, the source node of the transistor MN1 is connected to the drain node of the transistor MN2. In addition, the drain node of the transistor MN1 is connected to a ground potential VSS.

A gate node of the transistor MN21 is also connected to the comparison circuit 210. That is, a gate node of the transistor MN21 is connected to the drain node of the transistor MP3. The gate node of the transistor MN21 is also connected to the gate node of the transistor MN2. In addition, a source node of the transistor MN21 is connected to the ground potential VSS, and a drain node of the transistor MN21 is connected to the output terminal NCSN of the output buffer circuit 100.

Figure 4:
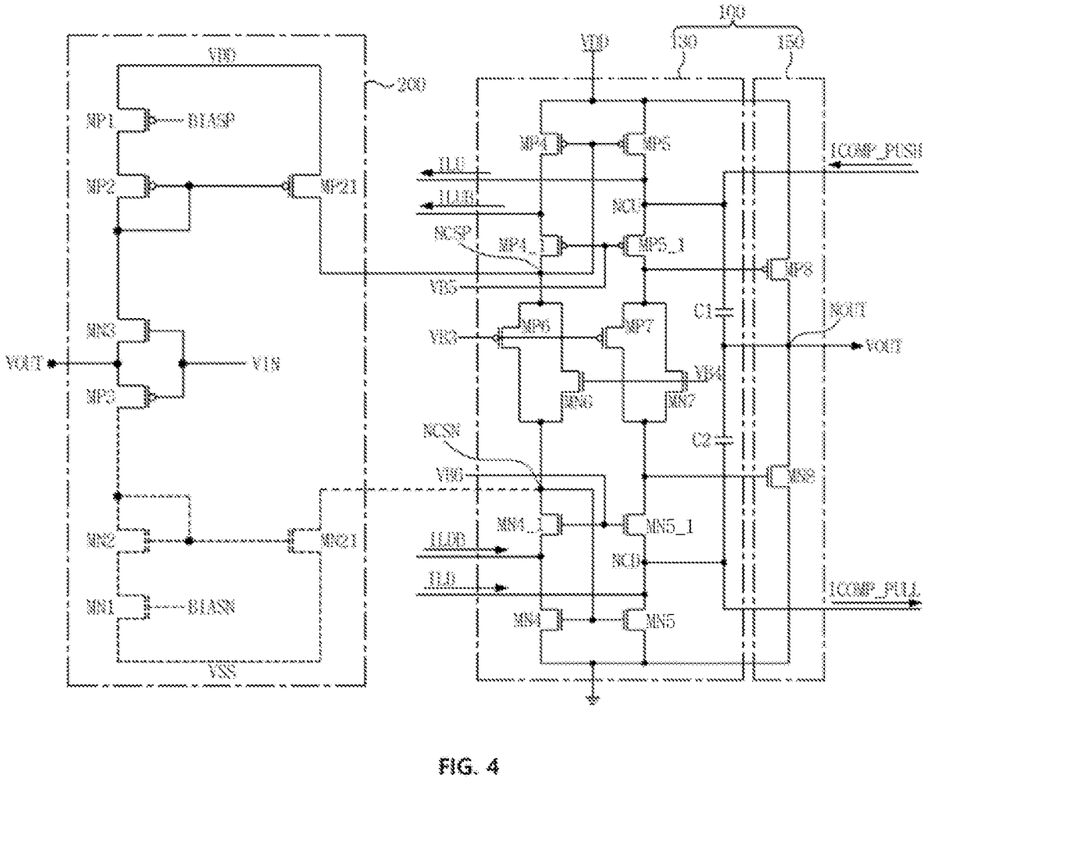
FIGS. 4 and 5 are circuit diagrams illustrating a link operation between a slew boost amplifier and an output buffer circuit according to an embodiment of the present disclosure.
Figure 5:
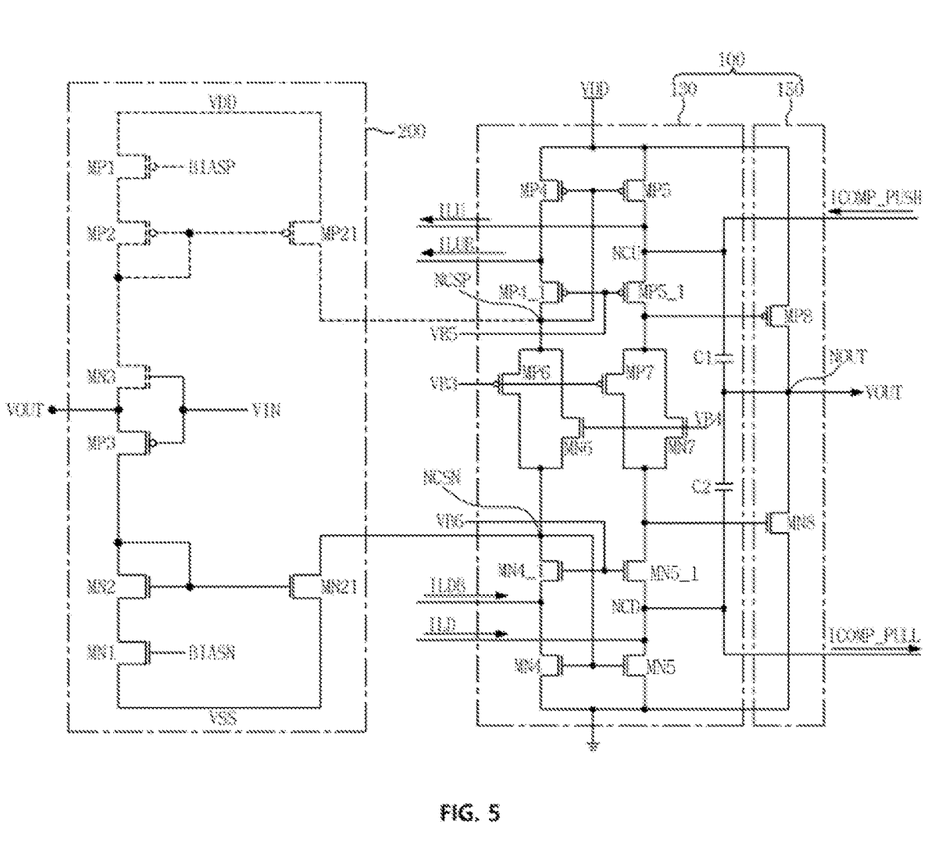

FIGS. 4 and 5 are circuit diagrams illustrating a link operation between a slew amplification circuit and an output buffer circuit according to an embodiment of the present disclosure.

With reference to FIG. 4, when the input voltage VIN (which may be an input signal to an amplifier elsewhere in the DDI) has a voltage equal to or greater than the output voltage VOUT (which is an output signal from the amplifier elsewhere in the DDI), optionally plus |Vth|, the threshold voltage of the transistor MN3, whereby a first current path from the transistor MP1 through the transistor MN3 carries a current. Alternatively, when the input voltage VIN is equal to or greater than the threshold voltage of the transistor MN3, the transistor MN3 may conduct a current and may output the current on the output node VOUT. The current flowing on the first current path is reproduced or "mirrored" by the transistor MP21.

A drain node of the transistor MP21 is connected to the gate nodes of the transistors MP4 and MP5 of the output buffer circuit 100, thereby increasing the voltage on the gates of the transistors MP4 and MP5. Accordingly, the currents conducted by the transistors MP4 and MP5 decrease, the voltage on the gate of the transistor MP8 (e.g., the pull-up driver) rapidly decreases, and thus the output voltage VOUT (e.g., on the node NOUT), which is the output of the output circuit 150 in the output buffer 100, rises.

In addition, the current flowing through the transistor MP21 may increase the current of the transistor MN4 of the output buffer circuit 100 so that the current of the transistor MN5 of the output buffer circuit 100 may also increase.

Accordingly, the voltage on the gate of the transistor MP8 decreases, and the gate-source potential across the transistor MP8 may also rapidly decrease, thereby increasing the slew rate of the output voltage VOUT. When the output voltage VOUT decreases, and the difference between the input voltage and the output voltage is no greater than |Vth|, the slew boost amplifier 200 may turn off the first current path, so additional current consumption of the slew boost amplifier 200 may not occur.

As for the opposite operation, with reference to FIG. 5, when the input voltage VIN (which may be an input signal to an amplifier elsewhere in the DDI) has a voltage less than the output voltage VOUT (which may be an output signal from the amplifier elsewhere in the DDI), either absolutely or by at least |Vth| (which may be the threshold voltage of the transistor MP3), a second current path from the transistor MP3 through the transistor MN1 carries a current. Alternatively, when the input voltage VIN is less than the power supply VDD, alone or minus the threshold voltage of the transistor MP3, the transistor MP3 may conduct a current and may draw or sink the current from the output node VOUT. The current flowing on the second current path is reproduced by the transistor MN21.

A drain node of the transistor MN21 is connected to the gate nodes of the transistors MN4 and MN5 of the output buffer circuit 100, thereby decreasing the voltage on the gates of the transistors MN4 and MN5. As a result, the currents conducted by the transistors MN4 and MN5 decrease, and the voltage on the gate of the transistor MN8 (e.g., the pull-down driver) rapidly increases.

In addition, the current flowing through the transistor MN21 may increase the current of the transistor MP4 of the output buffer circuit 100 so that the current of the transistor MP5 of the output buffer circuit 100 may also increase.

Accordingly, since the voltage on the gate of the transistor MN8 rapidly increases, the gate-source potential across the transistor MN8 also rapidly increases, thereby increasing the slew rate of the output voltage VOUT. When the output voltage VOUT decreases, and the difference between the input voltage and the output voltage is no greater than |Vth|, the second current path may not conduct a current, so additional current consumption of the slew boost amplifier 200 may not occur.

Figure 6:
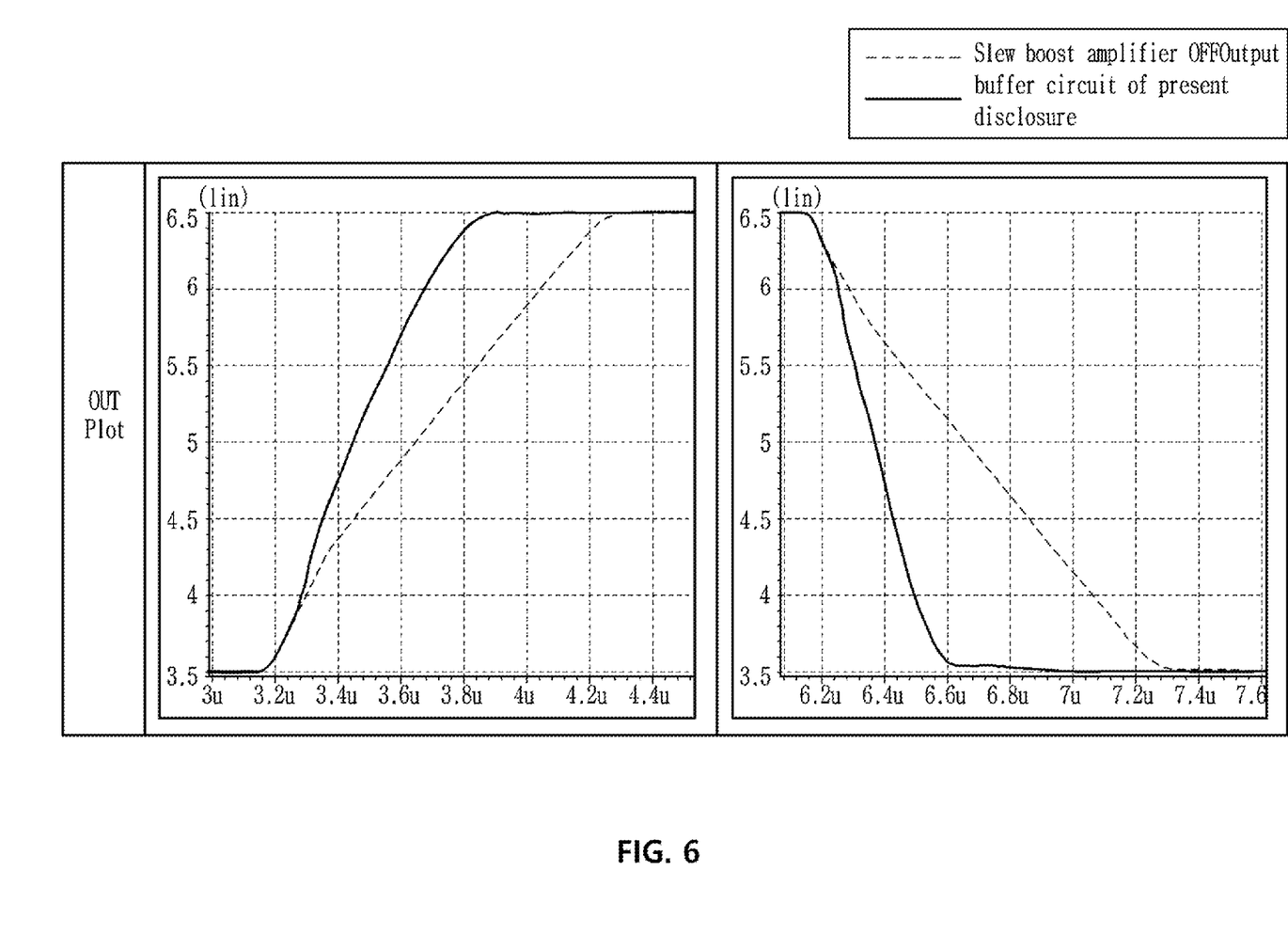
FIG. 6 shows graphs comparing and illustrating output waveforms of a slew boost amplifier circuit according to an embodiment of the present disclosure.

FIG. 6 shows graphs for comparing and illustrating output waveforms of a slew boost amplifier circuit according to an embodiment of the present disclosure.

With reference to FIG. 6, it may be seen that a high slew rate is realized when the slew boost amplifier 200 according to an embodiment of the present disclosure is used, when compared to the slew boost amplifier not being used (OFFOutput).

As described above, the slew boost amplifier 200 and the display driver having the same may provide a current path by comparing an input voltage and an output voltage, thereby amplifying a high slew rate without increasing power consumption (current consumption).

In addition, the slew boost amplifier 200 and the display driver having the same may provide a high slew rate without an increase in power consumption, thereby realizing a high slew rate even in a portable electronic device.

In addition, the slew boost amplifier 200 and the display driver having the same may increase or amplify the slew rate by comparing the input voltage and the output voltage, thereby allowing the slew rate to be increases or amplified even without an additional control circuit, and may embody slew amplification or slew rate improvement using a circuit having a small area.

The above-detailed description is illustrative of the present disclosure. In addition, the above description shows and describes exemplary embodiments of the present disclosure, and the present disclosure may be used in various other combinations, modifications, and environments. That is, changes or modifications are possible within the scope of the concept of the invention disclosed herein, the scope equivalent to the written disclosure, and/or within the scope of skill or knowledge in the art. The above-described embodiments may describe the best state for implementing the technical idea of the present disclosure, and various modifications for specific fields and/or applications and uses of the present disclosure are possible. Accordingly, the detailed description of the present disclosure is not intended to limit the present disclosure to the disclosed embodiments.

The invention claimed is:

1. A slew boost amplifier, connected to an output buffer circuit having an upper current mirror circuit and a lower current mirror circuit, comprising:
   a first current generation circuit configured to apply a first current to the upper current mirror circuit;
   a second current generation circuit configured to apply a second current to the lower current mirror circuit, the second current generation circuit comprising:
      a first transistor having a gate node and a source node connected to a drain node of a second transistor,
      a third transistor having a gate node configured to receive a first bias signal, and a source node connected to a drain node of the first transistor, and
      a fourth transistor having a gate node connected to the drain node of the second transistor, a source node connected to a ground potential, and a drain node connected to a first output terminal of the lower current mirror circuit; and
   a comparison circuit configured to detect a difference between an input voltage and an output voltage and to cause the first current generation circuit to apply the first current when the difference is greater than or equal to a first predetermined threshold and the second current generation circuit to apply the second current when the difference is less than a second predetermined threshold, wherein when the input voltage is less than (i) the output voltage, (ii) a first set value less than the output voltage, or (iii) less than a power supply minus a threshold voltage of the second transistor, the second transistor provides a current path connected to the first transistor and the second transistor, and the fourth transistor applies a third current mirroring the second current to the first output terminal of the lower current mirror circuit.

2. The amplifier of claim 1, wherein when the input voltage is at least a second set value greater than the output voltage, the first current generation circuit applies the first current to a first output terminal of the upper current mirror circuit.

3. The amplifier of claim 1, wherein when the input voltage is less than the output voltage by at least the first set value, the second current generation circuit applies the second current to a first output terminal of the lower current mirror circuit.

4. A slew boost amplifier, connected to an output buffer circuit having an upper current mirror circuit and a lower current mirror circuit, comprising:
  a first current generation circuit configured to apply a first current to a first output terminal of the upper current mirror circuit;
  a second current generation circuit configured to apply a second current to a first output terminal of the lower current mirror circuit; and
  a comparison circuit configured to detect a difference between an input voltage and an output voltage and to cause one of the first current generation circuit and the second current generation circuit to apply the first current or the second current when the difference occurs,
  wherein the comparison circuit comprises:
    a first transistor providing a first current path, having a gate node connected to a power input line and/or configured to receive the input voltage, a source node connected to a line providing the output voltage, and a drain node connected to the first current generating circuit, and
    a second transistor providing a second current path, having a gate node connected to the power input line and/or configured to receive the input voltage, a source node connected to the line providing the output voltage, and a drain node connected to the second current generating circuit;
  the second current generation circuit comprises:
    a third transistor having a gate node and a source node connected to the drain node of the second transistor,
    a fourth transistor having a gate node configured to receive a first bias signal, and a source node connected to a drain node of the third transistor, and
    a fifth transistor having a gate node connected to the drain node of the second transistor, a source node connected to a ground potential, and a drain node connected to the first output terminal of the lower current mirror circuit; and
  when the input voltage is less than (i) the output voltage, (ii) a second set value less than the output voltage, or (iii) less than a power supply minus a threshold voltage of the second transistor, the second transistor provides the second current path, the second current path being connected to a sixth transistor and a seventh transistor, and an eighth transistor applies a fourth current mirroring the second current to the first output terminal of the lower current mirror circuit.

5. The amplifier of claim 4, wherein the first current generation circuit comprises:
  the sixth transistor, the sixth transistor having a gate node and a source node connected to the drain node of the first transistor;
  the seventh transistor, the seventh transistor having a gate node configured to receive a first bias signal, and a source node connected to a drain node of the sixth transistor; and
  the eighth transistor, the eighth transistor having a gate node connected to the drain node of the first transistor, a source node connected to a power supply, and a drain node connected to first output terminal of the upper current mirror circuit.

6. The amplifier of claim 5, wherein when the input voltage is greater than or equal to (i) the output voltage, (ii) a first set value greater than the output voltage, or (iii) greater than a threshold voltage of the first transistor, the first transistor provides the first current path, the first current path being connected to the sixth transistor and the seventh transistor, and
  the eighth transistor applies a third current mirroring the first current to the first output terminal of the upper current mirror circuit.

7. A display driver, comprising:
  an output buffer circuit comprising an upper current mirror circuit and a lower current mirror circuit and outputting a first signal and a second signal in response to an input signal; and
  a slew boost amplifier configured to apply a current to one of the upper current mirror circuit and the lower current mirror circuit on the basis of a difference between the input signal and an output signal, the slew boost amplifier comprising a first current generation circuit configured to apply a first current to an output terminal of the upper current mirror circuit, a second current generation circuit configured to apply a second current to an output terminal of the lower current mirror circuit, and a comparison circuit configured to detect the difference between the input voltage and the output voltage and to output the output voltage by opening a current path in one of the first current generation circuit and the second current generation circuit when the difference occurs, wherein:
  when the input voltage is less than (i) the output voltage, (ii) a first set value less than the output voltage, or (iii) less than a power supply minus a threshold voltage of a second transistor in the comparison circuit, the second current generation circuit carries the second current on a second current path, and the second current generation circuit applies the second current on the second current path to the output terminal of the lower current mirror circuit.

8. The driver of claim 7, wherein when the input voltage is greater than or equal to (i) the output voltage, (ii) a second set value greater than the output voltage, or (iii) greater than a threshold voltage of a first transistor in the comparison circuit, the first current generation circuit carries the first current on a first current path, and
  the first current generation circuit applies the first current on the first current path to the output terminal of the upper current mirror circuit.

9. A display driver, comprising:
  an output buffer circuit comprising an upper current mirror circuit and a lower current mirror circuit and outputting a first signal and a second signal in response to an input signal; and
  a slew boost amplifier configured to apply a current to one of a first output terminal of the upper current mirror circuit and a first output terminal of the lower current mirror circuit on a basis of a difference between the input signal and an output signal, wherein the slew boost amplifier comprises:
- a first current generation circuit configured to apply a first current to the first output terminal of the upper current mirror circuit;
- a second current generation circuit configured to apply a second current to the first output terminal of the lower current mirror circuit; and
- a comparison circuit configured to detect the difference between the input voltage and the output voltage and to apply the first current to the first output terminal of the upper current mirror circuit or the second current to the first output terminal of the lower current mirror circuit from a first current path in the first current generation circuit or a second current path in the second current generation circuit when the difference occurs;

the comparison circuit comprises:
- a first transistor providing the first current path, having a gate node connected to a power input line and/or configured to receive the input voltage, a source node connected to a line providing the output voltage, and a drain node connected to the first current generating circuit, and
- a second transistor providing a second current path, having a gate node connected to the power input line and/or configured to receive the input voltage, a source node connected to the line providing the output voltage, and a drain node connected to the second current generating circuit;

the first current generation circuit comprises:
- a third transistor having a gate node and a source node connected to the drain node of the first transistor;
- a fourth transistor having a gate node configured to receive a first bias signal, and a source node connected to a drain node of the third transistor; and
- a fifth transistor having a gate node connected to the drain node of the first transistor, a source node connected to a power supply, and a drain node connected to the first output terminal of the upper current mirror circuit;

the second current generation circuit comprises:
- a sixth transistor having a gate node and a source node connected to the drain node of the second transistor;
- a seventh transistor having a gate node configured to receive a second bias signal, and a source node connected to a drain node of the sixth transistor; and
- an eighth transistor having a gate node connected to the drain node of the second transistor, a source node connected to a ground potential, and a drain node connected to the first output terminal of the lower current mirror circuit;

wherein when the input voltage is greater than or equal to (i) the output voltage, (ii) a first set value greater than the output voltage, or (iii) greater than a threshold voltage of the first transistor, the first transistor provides the first current path, the first current path being connected to the third transistor and the fourth transistor, and the fifth transistor applies a third current mirroring the first current to the first output terminal of the upper current mirror circuit; and when the input voltage is less than (i) the output voltage, (ii) a second set value less than the output voltage, or (iii) less than a power supply minus a threshold voltage of the second transistor, the second transistor provides the second current path, the second current path being connected to the sixth transistor and the seventh transistor, and the eighth transistor applies a fourth current mirroring the second current to the first output terminal of the lower current mirror circuit.

10. The driver of claim 9, wherein the output buffer circuit comprises:
- a load circuit; and
- an output circuit, wherein the load circuit comprises:
- an upper current mirror circuit comprising ninth and tenth transistors, each having a gate connected to the drain node of the fifth transistor; and
- a lower current mirror circuit comprising eleventh and twelfth transistors, each having a gate connected to the drain node of the eighth transistor, and the output circuit comprises:
- a thirteenth transistor having a gate connected to a second output terminal of the upper current mirror circuit and connected between the power supply and an output terminal of the output circuit; and
- a fourteenth transistor having a gate connected to a second output terminal of the lower current mirror circuit and connected between the output terminal of the output circuit and the ground potential.

11. The driver of claim 10, wherein the load circuit further comprises:
- a first connection circuit including a fifteenth transistor configured to receive a first bias voltage and a sixteenth transistor configured to receive a second bias voltage; and
- a second connection circuit including a seventeenth transistor configured to receive the first bias voltage and an eighteenth transistor configured to receive the second bias voltage;

wherein the first connection circuit electrically connects the second output terminal of the upper current mirror circuit and the second output terminal of the lower current mirror circuit, and the second connection circuit electrically connects the first output terminal of the upper current mirror circuit and the first output terminal of the lower current mirror circuit.

\* \* \* \* \*